United States Patent
Liaw et al.

[11] Patent Number: 5,904,520
[45] Date of Patent: May 18, 1999

[54] METHOD OF FABRICATING A CMOS TRANSISTOR

[75] Inventors: Shiou-Han Liaw; Feng-Ling Hsiao, both of Hsinchu, Taiwan

[73] Assignee: Utek Semiconductor Corp., Taiwan

[21] Appl. No.: 09/002,930

[22] Filed: Jan. 5, 1998

[51] Int. Cl.[6] .............................................. H04L 21/8238
[52] U.S. Cl. .................... 438/227; 438/230; 438/231; 438/305; 438/306; 438/307; 438/232
[58] Field of Search .................... 438/301, 303, 438/305, 306, 307, 230, 229, 231, 232, 227, 228, FOR. 204, FOR. 216, FOR. 217, FOR. 218

[56] References Cited

U.S. PATENT DOCUMENTS

| | | | |
|---|---|---|---|
| 4,577,391 | 3/1986 | Hsia et al. | 29/571 |
| 4,757,026 | 7/1988 | Woo et al. | 437/29 |
| 5,616,401 | 4/1997 | Kobayashi et al. | 428/212 |
| 5,759,885 | 6/1998 | Son | 438/230 |
| 5,766,991 | 6/1998 | Chen | 438/231 |
| 5,786,247 | 7/1998 | Chang et al. | 438/231 |

FOREIGN PATENT DOCUMENTS

| | | | |
|---|---|---|---|
| 356050535 | 5/1981 | Japan | 438/FOR. 216 |
| 358218161 | 12/1983 | Japan | 438/FOR. 168 |
| 404098869 | 3/1992 | Japan | 438/FOR. 168 |
| 404107819 | 4/1992 | Japan | 438/FOR. 168 |
| 406216324 | 8/1994 | Japan | 438/FOR. 217 |

*Primary Examiner*—Peter Toby Brown
*Assistant Examiner*—Long Pham

[57] ABSTRACT

A gate oxide and a first conducting layer are formed on a substrate, and then the first conducting layer is patterned and a gate in a NMOS region is formed. A LDD, a sidewall spacer, and a drain/source in the NMOS region are then formed in series. A layer of hard mask is formed. The layer of hard mask and the first conducting layer are patterned and a gate in a PMOS region is formed. A LDD, a sidewall spacer, and a drain/source in the NMOS region are then formed in series.

22 Claims, 3 Drawing Sheets

METHOD OF FABRICATING A CMOS TRANSISTOR

BACKGROUND OF THE INVENTION (1) Field of the Invention

The present invention relates to a method of fabricating a CMOS(Complementary Metal-Oxide-Semiconductor) transistor of integrated circuits.

(2) Description of the Related Art

Integrated circuits which are based on complementary metal-oxide-semiconductor (CMOS) technologies are firmly established in modern electronics. A CMOS transistor, which comprises an n-channel(NMOS) and a p-channel(PMOS) transistor, provides the important characteristics needed for both low power dissipation and high integration density designs.

The conventional method of fabricating a CMOS needs five lithographic processes from defining gates to source/drain implantation. The process steps from defining gates to source/drain implantation are briefly described as follows:

(a). forming a first photo resist over a conducting layer and defining gates of both NMOS and PMOS regions.

(b). forming a second photo resist over the NMOS (or PMOS) region and defining a first lightly doped region, and then executing a first ion implantation to form a lightly doped drain/source of an NMOS (or PMOS) transistor.

(c). forming a third photo resist over the PMOS (or NMOS) region and defining a second lightly doped region, and then executing a second ion implantation to form a lightly doped drain/source of a PMOS (or NMOS) transistor.

(d). forming sidewall spacers of the gates of the NMOS transistor and the PMOS transistor.

(e). forming a fourth photo resist over the NMOS (or PMOS) region and defining a first source/drain region, and then executing a third ion implantation to form a drain/source of the NMOS (or PMOS) transistor.

(f). forming a fifth photo resist over the PMOS (or NMOS) region and defining a second source/drain region, and then executing a third ion implantation to form a drain/source of the PMOS (or NMOS) transistor.

Every lithographic process includes lots of steps, such as dehydration bake, priming, photo resist coating, soft bake, exposure, development, after develop inspection and line width measurement, post bake and deep UV hardening, and so on. As mentioned above, the conventional method of fabricating a CMOS needs five lithographic processes from defining gates to source/drain implantation. Therefore, the conventional method takes a lot of cost and fabrication time, and thus decreases the throughput of the production.

The present invention discloses a new method of fabricating a CMOS by using only two lithographic processes. Accordingly, the present invention can not only reduce the cost and time of the manufacture, but also promote the process margin of fabricating the PMOS or the NMOS device of the CMOS.

SUMMARY OF THE INVENTION

Accordingly, it is a primary object of the present invention to provide a method of fabricating a CMOS transistor with reduced number of photolithography steps.

It is another object of the present invention to provide a method of fabricating a CMOS transistor with promoted process margin.

In accordance with the objects of this invention, there is shown a method of fabricating a CMOS transistor. A silicon substrate having a field oxide, a P-well and an N-well is provided. The P-well identifies an NMOS region and the N-well identifies a PMOS region. A gate oxide and a first conducting layer are formed on the substrate surface in consequence, and then the first conducting layer is patterned and a gate in the NMOS region is formed. After a lightly doped drain/source (LDD) in the NMOS region is formed, a sidewall spacer of the gate in the NMOS region is formed. The substrate is then heavily implanted to form a drain/source in the NMOS region.

The layer of hard mask, which is a dielectric layer such as nitride, oxide, or oxynitride, is formed on the substrate. Thereafter, the layer of hard mask and the first conducting layer are patterned and a gate in the PMOS region is formed. After a lightly doped drain/source (LDD) in the PMOS region is formed, a sidewall spacer of the gate in the PMOS region is formed. The substrate is then heavily implanted to form a drain/source in the PMOS region. A key point of the present invention is that the sidewall spacer of the gate in the PMOS region is wider in the present invention due to the layer of hard mask stacked over the gate. Therefore, a process margin is gained for the fabrication of the PMOS. In addition, as the sidewall spacer becomes wider, the lightly doped drain/source of the PMOS region also becomes wider, and thus the hot election effect of PMOS becomes small. Consequently, the performance and the reliability of products is increased.

BRIEF DESCRIPTION OF THE DRAWINGS

The accompanying drawings forming a material part of this description, in which.

DESCRIPTION OF THE PREFERRED EMBODIMENT

Figure 1:
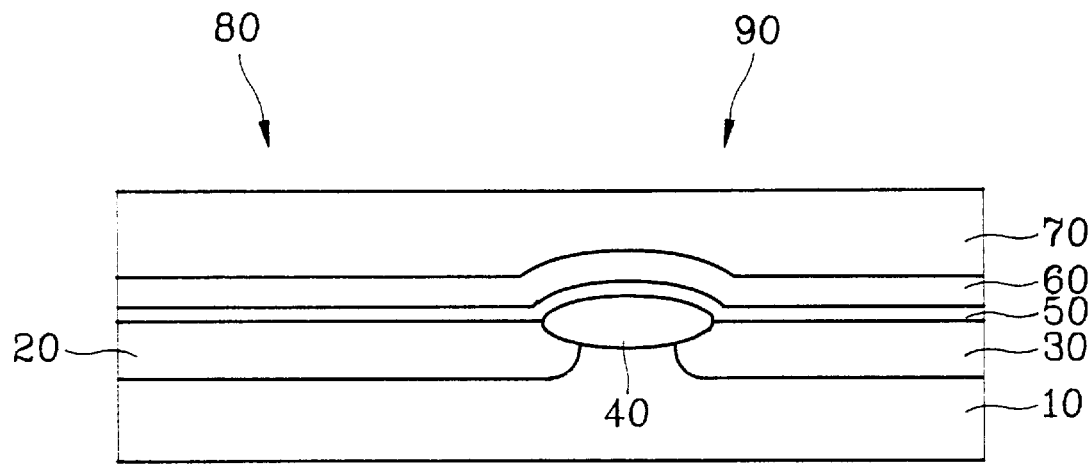
FIG. 1 is a cross sectional view showing a gate oxide, a first conducting layer, and a first photo resist are formed in series on a substrate having a P-well (NMOS region), an N-well (PMOS region), and a field oxide, in accordance with the present invention.

Referring now in detail to the drawings for the purpose of illustrating preferred embodiments of the present invention, the processes for fabricating a CMOS transistor with reduced number of photolithography steps as shown in FIGS. 1 to 6 comprise the following steps:

Referring now to FIG. 1, a schematic cross-sectional view of a P-type silicon substrate 10 is shown, having a P-well 20 and an N-well 30 in the substrate. A field oxide 40 is then formed by thermal oxidation of the substrate surface to isolate the P-well and the N-well. The P-well identifies an NMOS region 80 and the N-well identifies a PMOS region 90. If required to prevent surface inversion, a P-type dopant, such as boron can be implanted in the field oxide area, prior to forming the field oxide. Thereafter, a gate oxide 50 and a first conducting layer 60 are formed on the substrate surface in series, and then a first layer of photo resist 70 is coated over the conducting layer 60.

For this invention, the preferred thickness of the field oxide 40 is between about 3500 to 9000 Angstroms. The gate oxide 50 is formed by thermal oxidation, and the preferred thickness of the gate oxide is between 60 to 300 Angstroms. The first conducting layer 60 is generally composed of a polysilicon/polysilicide structure, and is formed by low pressure chemical vapor deposition (LPCVD).

Figure 2:
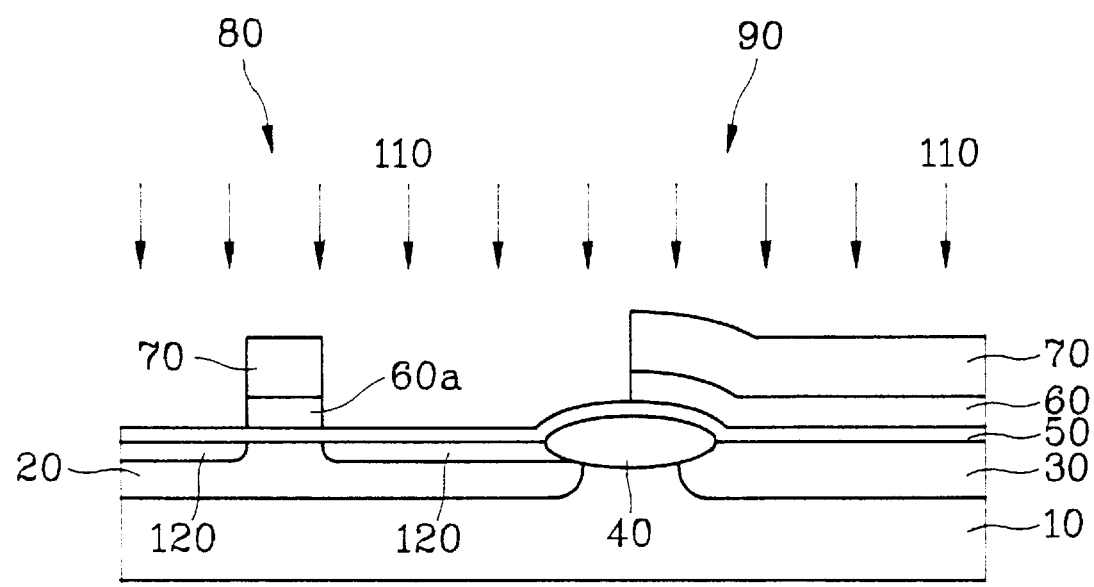
FIG. 2 is a cross sectional view showing a gate and a LDD of a transistor are formed in the NMOS region of FIG. 1.

Referring now to FIG. 2, the first conducting layer 60 is patterned by using conventional photolithographic steps and plasma etching partially, and a gate 60a in the NMOS region 80 is formed. The substrate 10, having the first layer of photo resist 70 still protecting the PMOS region 90, is then lightly implanted with phosphorous ($P^{31}$) ions 110 to form a lightly doped drain/source (LDD)120 in the NMOS region. The phosphorous ions are implanted at an energy range of between 20 to 50 KeV, and at a dose range of between $1E13$ $cm^{-2}$ to $1E14$ $cm^{-2}$.

Figure 3:
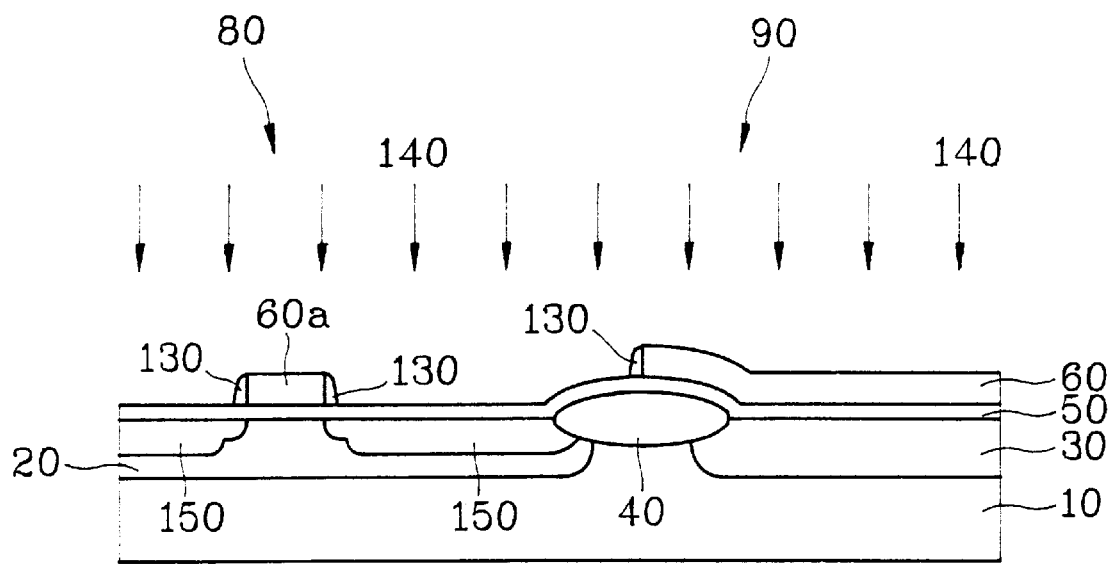
FIG. 3 is a cross sectional view showing a sidewall spacer and a source/drain of a transistor is formed in the NMOS region of FIG. 2.

Referring now to FIG. 3, after the first layer of photo resist 70 is removed, a sidewall spacer 130 of the gate 60a in the NMOS region 80 is formed. The formation of the sidewall spacer 210 is to deposit an oxide layer first by low pressure chemical vapor deposition (LPCVD) or plasma enhanced chemical vapor deposition(PECVD), using tetraethoxysilane (TEOS) as the reactant gas, and then the oxide layer is etched back continuously. The substrate 10 is then heavily implanted with arsenic ($As^{75}$) ions 140 to form a drain/source 150 in the NMOS region 80. The arsenic ions are implanted at an energy range of between 40 to 60 KeV, and at a dose range of between $1E15$ $cm^{-2}$ to $5E15$ $cm^{-2}$.

Figure 4:
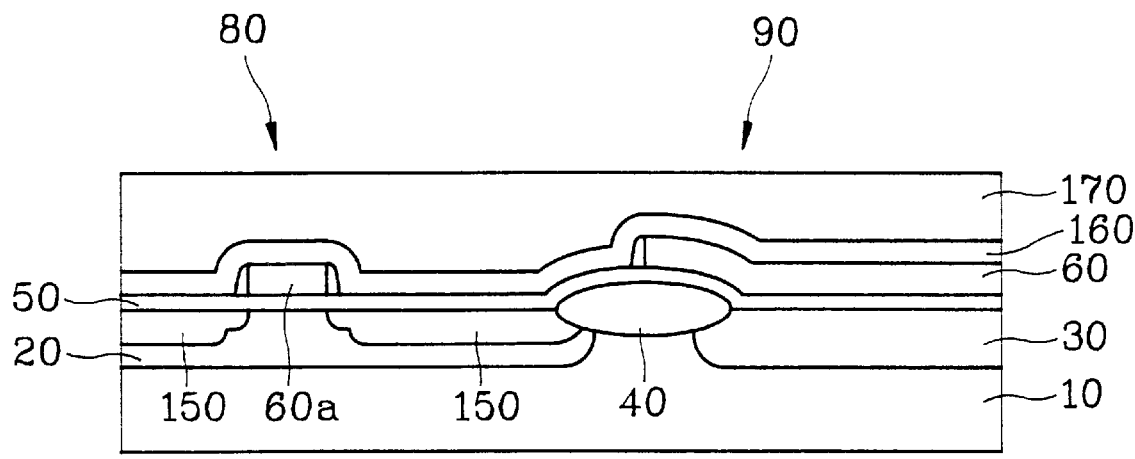
FIG. 4 is a cross sectional view showing a layer of hard mask and a second photo resist are formed on the whole substrate of FIG. 3.

Referring now to FIG. 4, a layer of hard mask 160 is formed on the substrate, and then a second photo resist 170 is coated on the layer of hard mask 160. The layer of hard mask, which is a dielectric layer such as nitride, oxide, or oxynitride, is formed by using chemical vapor deposition. The aim of the layer of hard mask is to protect all devices in the NMOS region 80, such that the devices in the NMOS region wouldn't be attacked while a lightly doped implantation and a heavily doped implantation are being executed in the PMOS region 90. Therefore, the preferred thickness of the layer of hard mask 160 is between about 150 to 1500 Angstroms, and depends on the energy of the following lightly doped implantation and the following heavily doped implantation in the PMOS region 90.

Figure 5:
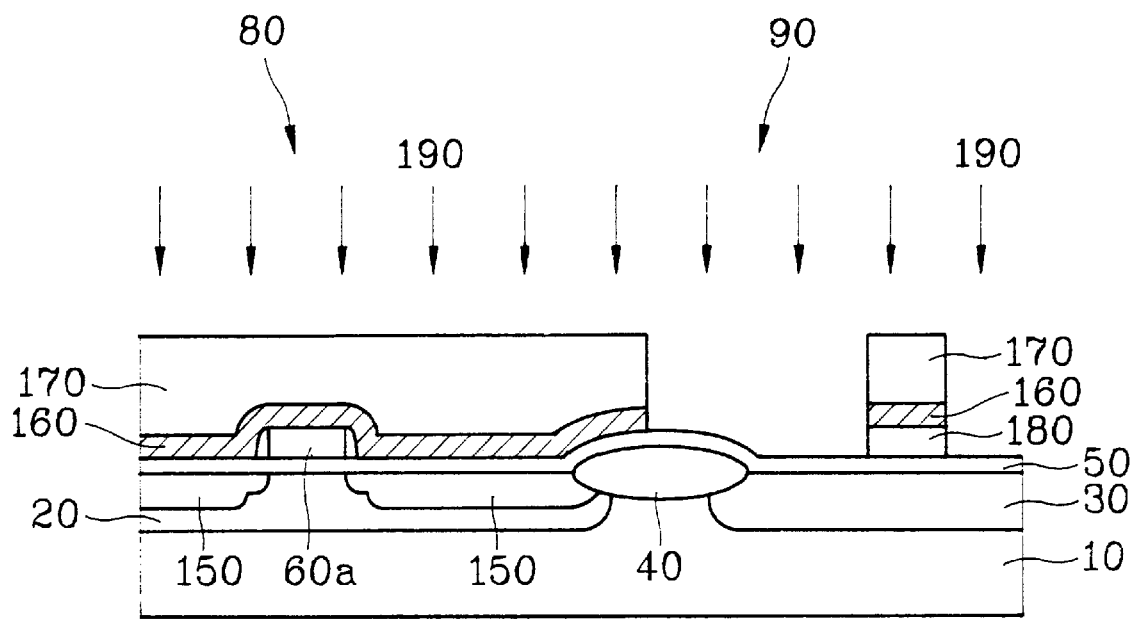
FIG. 5 is a cross sectional view showing a gate and a LDD of a transistor are formed in the PMOS region of FIG. 4.

Referring now to FIG. 5, the layer of hard mask 160 and the first conducting layer 60 are patterned by using the conventional photolithography steps and plasma etching partially, and then a gate 180 in the PMOS region 90 is formed. In addition, the layer of hard mask 160 in the NMOS region 80 is still remained. The substrate 10, having the layer of hard mask 160 still protecting the NMOS region 80, is then lightly implanted with boron ($B^{11}$) ions 190 to form a lightly doped drain/source (LDD)200 in the PMOS region. The boron ions are implanted at an energy range of between 15 to 30 KeV, and at a dose range of between $1E13$ $cm^{-2}$ to $1E14$ $cm^{-2}$.

Figure 6:
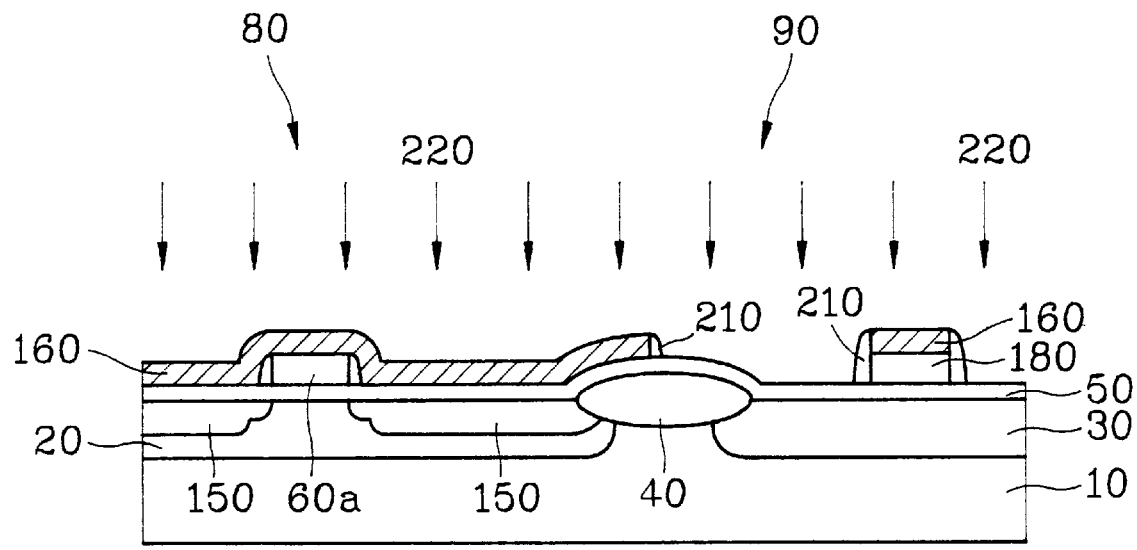
FIG. 6 is a cross sectional view showing a sidewall spacer and a source/drain of a transistor is formed in the PMOS region of FIG. 5.

Referring now to FIG. 6, after the second layer of photo resist 170 is removed, a sidewall spacer 210 of the gate 180 in the PMOS region 90 is formed. The formation of the sidewall spacer 210 is to deposit an oxide layer first by low pressure chemical vapor deposition (LPCVD) or plasma enhanced chemical vapor deposition(PECVD), using tetraethoxysilane (TEOS) as the reactant gas, and then the oxide layer is etched back continuously. The substrate 10 is then heavily implanted with boron bifluoride ions($BF_2^+$) 220 to form a drain/source 230 in the PMOS region 90. The boron bifluoride ions are implanted at an energy range of between 60 to 80 KeV, and at a dose range of between $1E15$ $cm^{-2}$ to $5E15$ $cm^{-2}$.

More particularly, a key point of the present invention, the sidewall spacer 210 of the gate 180 in the PMOS region 90 is wider due to the layer of hard mask 160 still stacked over the gate 180. Therefore, a process margin is gained for the fabrication of the PMOS. In addition, as the sidewall spacer becomes wider, the lightly doped drain/source 200 of the PMOS region 90 also becomes wider, and thus the hot election effect of PMOS becomes small. Consequently, the performance and the reliability of products is increased.

The invention being thus described, it will be obvious that the same may be varied in many ways. Such variations are not to be regarded as a departure from the spirit and scope of the invention, and all such modifications as would be obvious to one skilled in the art are intended to be included in the scope of the following claims.

What we claim is:

1. A method of fabricating a CMOS transistor composed of a NMOS transistor and a PMOS transistor, comprising the steps of:

(a) providing a silicon substrate having a P-well, and N-well, and a field oxide;

(b) forming a gate oxide and a first conducting layer on said silicon substrate;

(c) defining said first conducting layer to form a gate for the NMOS transistor, said NMOS transistor being located at said P-well;

(d) implanting ions of N– impurities into said substrate to form a lightly doped source/drain of said NMOS transistor;

(e) forming a sidewall spacer of said gate of said NMOS transistor;

(f) implanting ions of N+ impurities into said substrate to form a source and a drain of said NMOS transistor, wherein the first conducting layer acts as a hard mask to protect the NMOS transistor from the implantation of ions of N+ impurities;

(g) forming a layer of hard mask on said substrate;

(h) utilizing a patterned photoresist to define said layer of hard mask and to define said first conducting layer to form a gate for the PMOS transistor, said PMOS transistor being located at said N-well;

(i) implanting ions of P– impurities into said substrate to form a lightly doped source/drain of said PMOS transistor;

(j) forming a sidewall spacer of said gate of said PMOS transistor; and (k) implanting ions of P+ impurities into said substrate to form a source and a drain of said PMOS transistor.

2. The method of claim 1, wherein said N– impurities are phosphorous $P^{31}$.

3. The method of claim 2, wherein said phosphorous ions are implanted at an energy range of between 20 Kev to 50 Kev.

4. The method of claim 2, wherein said phosphorous ions are implanted into said substrate at a dose range of between $1E13$ $cm^{-2}$ to $1E14$ $cm^{-2}$.

5. The method of claim 1, wherein the step of forming a sidewall spacer of said gate of said NMOS transistor is to form an oxide layer first, and then to etch back said oxide layer.

6. The method of claim 1, wherein said ions of N+ impurities are arsenic As75.

7. The method of claim 6, wherein said arsenic ions are implanted at an energy range of between 40 Kev and 60 Kev.

8. The method of claim 6, wherein said arsenic ions are implanted into said substrate at a dose range of between $1E15$ cm$^{-2}$ to $5E15$ cm$^{-2}$.

9. The method of claim 1, wherein said layer of hard mask is a layer of nitride.

10. The method of claim 1, wherein said layer of hard mask is a layer of oxide.

11. The method of claim 1, wherein said layer of hard mask is a layer of oxynitride.

12. The method of claim 1, wherein the thickness of said layer of hard mask is between about 150 to 1500 Angstroms.

13. The method of claim 1, wherein said P− impurities are boron $B^{11}$.

14. The method of claim 13, wherein said boron ions are implanted at an energy range of between 15 Kev to 30 Kev.

15. The method of claim 13, wherein said boron ions are implanted into said substrate at a dose range of between $1E13$ cm$^{-2}$ to $1E14$ cm$^{-2}$.

16. The method of claim 1, wherein the step of forming a sidewall spacer of said gate of said PMOS transistor is to form an oxide layer first, and then to etch back said oxide layer.

17. The method of claim 1, wherein said ions of N+ impurities are boron bifluoride $BF_2^+$.

18. The method of claim 17, wherein said $BF_2^+$ ions are implanted at an energy range of between 60 Kev to 80 Kev.

19. The method of claim 17, wherein said $BF_2^+$ ions are implanted into said substrate at a dose range of between $1E15$ cm$^{-2}$ to $5E15$ cm$^{-2}$.

20. A method of fabricating a CMOS transistor composed of a NMOS transistor and a PMOS transistor, comprising the steps of:

(a) providing a silicon substrate having a P-well, and N-well, and a field oxide;

(b) forming a gate oxide and a first conducting layer on said silicon substrate;

(c) defining said first conducting layer to form a gate for the PMOS transistor, said PMOS transistor being located at said N-well;

(d) implanting ions of P− impurities into said substrate to form a lightly doped source/drain of said PMOS transistor;

(e) forming a sidewall spacer of said gate of said PMOS transistor;

(f) implanting ions of P+ impurities into said substrate to form a source and a drain of said PMOS transistor, wherein the first conducting layer acts as a hard mask to protect the NMOS transistor from the implantation of ions of P+ impurities;

(g) forming a layer of hard mask on said substrate;

(h) utilizing a patterned photoresist to define said layer of hard mask and to define said first conducting layer to form a gate for the NMOS transistor, said NMOS transistor being located at said P-well;

(i) implanting ions of N− impurities into said substrate to form a lightly doped source/drain of said NMOS transistor;

(j) forming a sidewall spacer of said gate of said NMOS transistor; and (k) implanting ions of N+ impurities into said substrate to form a source and a drain of said NMOS transistor.

21. The method of claim 1 wherein the step of forming a gate oxide and a first conducting layer on said silicon substrate includes the step of forming a polysilicon layer on said silicon substrate.

22. The method of claim 20 wherein the step of forming a gate oxide and a first conducting layer on said silicon substrate includes the step of forming a polysilicon layer on said silicon substrate.

* * * * *